US010643050B2

(12) United States Patent
Park et al.

(10) Patent No.: US 10,643,050 B2
(45) Date of Patent: May 5, 2020

(54) MANUFACTURING METHOD FOR ULTRASONIC FINGERPRINT SENSOR

(71) Applicant: BEFS CO., LTD., Daejeon (KR)

(72) Inventors: Sang Young Park, Gyeonggi-do (KR); Young Tae Park, Seoul (KR)

(73) Assignee: BEFS CO., LTD., Daejeon (KR)

( * ) Notice: Subject to any disclaimer, the term of this patent is extended or adjusted under 35 U.S.C. 154(b) by 109 days.

(21) Appl. No.: 16/138,519

(22) Filed: Sep. 21, 2018

(65) Prior Publication Data

US 2019/0026520 A1 Jan. 24, 2019

Related U.S. Application Data

(63) Continuation of application No. PCT/KR2018/002971, filed on Mar. 14, 2018.

(30) Foreign Application Priority Data

Mar. 16, 2017 (KR) .................. 10-2017-0033133

(51) Int. Cl.
*G06K 9/00* (2006.01)
*H01L 41/113* (2006.01)
(Continued)

(52) U.S. Cl.
CPC ........ *G06K 9/0002* (2013.01); *H01L 41/1132* (2013.01); *H01L 41/183* (2013.01);
(Continued)

(58) Field of Classification Search
None
See application file for complete search history.

(56) References Cited

U.S. PATENT DOCUMENTS 5,844,349 A * 12/1998 Oakley ................... B06B 1/064
                                                                310/358
6,111,818 A * 8/2000 Bowen ................ B06B 1/0655
                                                              257/E27.006
(Continued)

FOREIGN PATENT DOCUMENTS

EP           1227525 A2 *  7/2002 ............. H01L 41/37
JP        2004039836 A      2/2004
(Continued)

*Primary Examiner* — Michelle Mandala
(74) *Attorney, Agent, or Firm* — Nelson Mullins Riley & Scarborough LLP; Kongsik Kim, Esq.

(57) ABSTRACT

A manufacturing method for an ultrasonic fingerprint sensor is provided. The method may include: preparing a sintered ceramic element under incomplete sintering conditions; forming a processed ceramic element by cutting a first surface of the sintered ceramic element along a first direction in pre-designated intervals up to such a depth that leaves a remainder region at a second surface and cutting the second surface of the sintered ceramic element along a second direction perpendicular to the first direction in pre-designated intervals up to such a depth that leaves a remainder region at the first surface; sintering the processed ceramic element under complete sintering conditions; filling an insulation material into troughs formed in the processed ceramic element by the cutting processes; and polishing the first surface and second surface to remove the remainder regions such that piezoelectric rods are exposed while arranged in an array form.

4 Claims, 4 Drawing Sheets

(51) Int. Cl.
  *H01L 41/43* (2013.01)
  *H01L 41/293* (2013.01)
  *H01L 41/337* (2013.01)
  *H01L 41/338* (2013.01)
  *H01L 41/18* (2006.01)

(52) U.S. Cl.
  CPC .......... *H01L 41/293* (2013.01); *H01L 41/337* (2013.01); *H01L 41/338* (2013.01); *H01L 41/43* (2013.01)

(56) References Cited

U.S. PATENT DOCUMENTS 9,294,014 B2 * 3/2016 Near ................... H01L 41/1134
2003/0098632 A1 * 5/2003 Takeuchi ........... G02B 6/12004
                                                                    310/328

FOREIGN PATENT DOCUMENTS

JP    2016530902 A    10/2016
KR    100561851 B1    3/2006
KR    101320138 B1    10/2013

* cited by examiner

MANUFACTURING METHOD FOR ULTRASONIC FINGERPRINT SENSOR

CROSS-REFERENCE TO RELATED APPLICATIONS

This application is a continuation of International Application No. PCT/KR2018/002971 filed on Mar. 14, 2018, which claims priority to Korean Application No. 10-2017-0033133 filed on Mar. 16, 2017. The applications are incorporated herein by reference in their entirety.

TECHNICAL FIELD

The present invention relates to a manufacturing method for an ultrasonic fingerprint sensor.

RELATED ART

Biometrics is a field of technology that enables high levels of security, and fingerprint recognition is an important part of biometrics.

Generally, fingerprint recognition may entail extracting certain patterns or characteristic points (for example, points where fingerprint ridges branch out, points where ridges end, etc.) from images of fingerprints taken from the input of a user's fingerprints and comparing these with the patterns or characteristic points of a fingerprint image stored beforehand.

A fingerprint sensor for recognizing a user's fingerprints can be manufactured in modular form, for example, to include peripheral parts or structures, or can be implemented in an integrated form on a physical function key and therefore, in recent times, is being mounted in different ways on various electronic devices.

FIG. 1 conceptually illustrates the composition of an ultrasonic fingerprint sensor based on the related art.

Referring to FIG. 1, an ultrasonic fingerprint sensor may include multiple piezoelectric rods 100 arranged to form an m×n sensor array, a multiple number of first electrode bars 106 arranged along a first direction to be in electrical contact with the upper ends of the multiple piezoelectric rods 100, and a multiple number of second electrode bars 108 arranged along a second direction to be in electrical contact with the lower ends of the multiple piezoelectric rods 100.

Reference numeral 102 represents a shielding layer, which is a protective coating formed over the first electrode bars 106 for allowing the finger to be placed close to the sensor array, and reference numeral 104 represents a support, which is attached to the end portion of the sensor array opposite the shielding layer 102 and supports the multiple piezoelectric rods 100 from underneath.

Here, the piezoelectric rods 100 can be made of a material having piezoelectric properties, where a material containing at least one of PZT (lead zirconate titanate), PST, quartz, (Pb, Sm)TiO3, PMN(Pb(MgNb)O3)-PT(PbTiO3), PVDF, and PVDF-TrFe, for example, can correspond to such a material.

If a voltage having a resonance frequency in the ultrasonic range is applied to the first electrode bars 106 connected to the upper end portions of the piezoelectric rods 100 and the second electrode bars 108 connected to the lower end portions, and the piezoelectric rods 100 are vibrated up and down, then an ultrasonic signal having a particular frequency may be generated and emitted, as illustrated in FIG. 2.

When there is no finger touching the shielding layer 102, the ultrasonic signal emitted from the piezoelectric rods 100 is unable to pass through the interface between the piezoelectric rods 100 and air, returning back into the piezoelectric rods 100.

However, when there is a finger touching, a portion of the emitted ultrasonic signal may penetrate the interface between the skin of the finger and the piezoelectric rods 100 to progress into the finger, and as the signal reflected back has a decreased intensity, this can be used to sense a fingerprint pattern.

The ultrasonic fingerprint sensor described above may be manufactured by sequentially performing a process for forming the individual piezoelectric rods 100 for forming the sensor array, a process for forming the multiple number of first electrode bars 106 on the upper side of the piezoelectric rods 100, a process for forming the multiple number of second electrode bars 108 on the lower side of the piezoelectric rods 100 in a direction orthogonal to that of the first electrode bars 106, and the like.

However, since, with the conventional ultrasonic fingerprint sensor, the piezoelectric rods 100 are formed by using a sintered ceramic element obtained from complete sintering (full sintering), the processing speed may be excessively prolonged.

SUMMARY

An aspect of the present invention is to provide a manufacturing method for an ultrasonic fingerprint sensor that can increase the speed of the ultrasonic fingerprint sensor manufacturing process by using a sintered ceramic element of an incompletely sintered state in forming the piezoelectric rods.

An aspect of the present invention is to provide a manufacturing method for an ultrasonic fingerprint sensor that enables the manufacture of an ultrasonic fingerprint sensor having a higher resolution by performing an additional sintering process on a processed ceramic element in which slots are formed for forming the piezoelectric rods.

Other objectives of the present invention will be easily understood from the descriptions provided below.

According to one aspect of the present invention, a manufacturing method for an ultrasonic fingerprint sensor is provided, where the manufacturing method includes: (a) preparing a sintered ceramic element in the form of a piezoelectric sheet sintered according to pre-designated incomplete sintering conditions; (b) forming a processed ceramic element by cutting from a first surface of the sintered ceramic element along a first direction in pre-designated intervals up to such a depth that leaves a remainder region at a second surface, which is a surface opposite from and not touching the first surface, and cutting from the second surface of the sintered ceramic element along a second direction, which is perpendicular to the first direction, in pre-designated intervals up to such a depth that leaves a remainder region at the first surface; (c) sintering the processed ceramic element according to pre-designated complete sintering conditions; (d) filling an insulation material into troughs formed in the processed ceramic element by the cutting processes of said step (b); and (e) polishing the first surface and the second surface to remove the remainder regions at the first surface and the second surface such that piezoelectric rods are exposed while arranged in an array form, where the remainder regions are portions of the sintered ceramic element remaining due to each of the cutting processes applied in one surface not reaching the opposite surface, a region of the sintered ceramic element for forming a piezoelectric rod is connected at both end portions with a region of the sintered ceramic element for forming another piezoelectric rod by way of the remainder regions, the incomplete sintering conditions include one or more of a heating temperature and a heating duration designated as a relatively poor condition compared to the complete sintering conditions, and the sintered ceramic element produced under the incomplete sintering conditions has a relatively lower density compared to a sintered ceramic element produced under the complete sintering conditions.

Step (e) above can include: polishing the first surface to remove the remainder region present at the first surface side such that the piezoelectric rods are exposed while arranged in an array form; forming a multiple number of first electrode bars on the first surface side along a third direction to be electrically connected with the exposed end portions of the multiple piezoelectric rods, where the third direction can be one of the first direction and the second direction; polishing the second surface to remove the remainder region present at the second surface side such that the piezoelectric rods are exposed while arranged in an array form; and forming a multiple number of second electrode bars on the second surface side along a fourth direction to be electrically connected with the exposed end portions of the multiple piezoelectric rods, where the fourth direction is the other of the first direction and the second direction.

Another aspect of the present invention provides an ultrasonic fingerprint sensor manufactured by the method for manufacturing an ultrasonic fingerprint sensor described above.

Additional aspects, features, and advantages other than those described above will be made apparent from the drawings, scope of claims, and detailed description of the present invention provided below.

An embodiment of the present invention provides the advantage of increasing the speed of a process for manufacturing an ultrasonic fingerprint sensor, since the piezoelectric rods may be formed by using a sintered ceramic element in an incompletely sintered state.

There is also the advantage that it is possible to manufacture an ultrasonic fingerprint sensor with a higher resolution by performing an additional sintering process on a processed ceramic element that has troughs formed therein for forming the piezoelectric rods.

DETAILED DESCRIPTION

Figure 1:
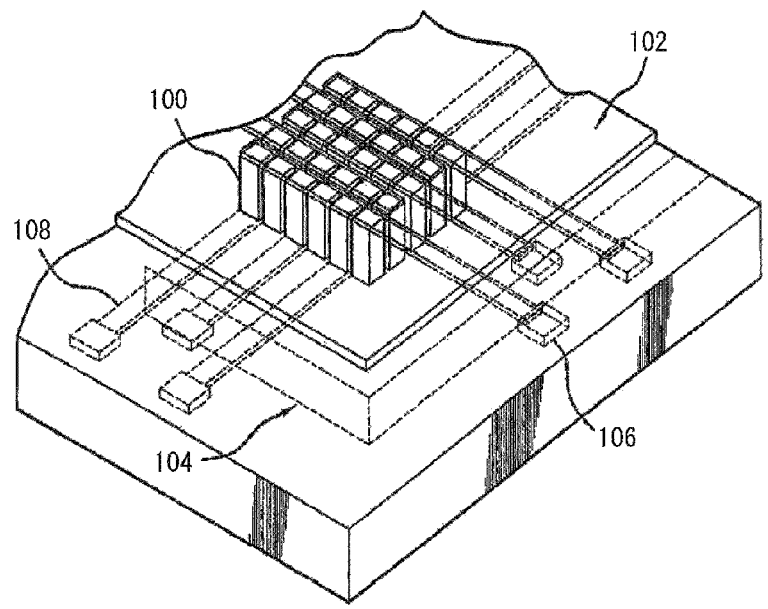
FIG. 1 is a diagram conceptually illustrating the composition of an ultrasonic fingerprint sensor according to the related art.
Figure 2:
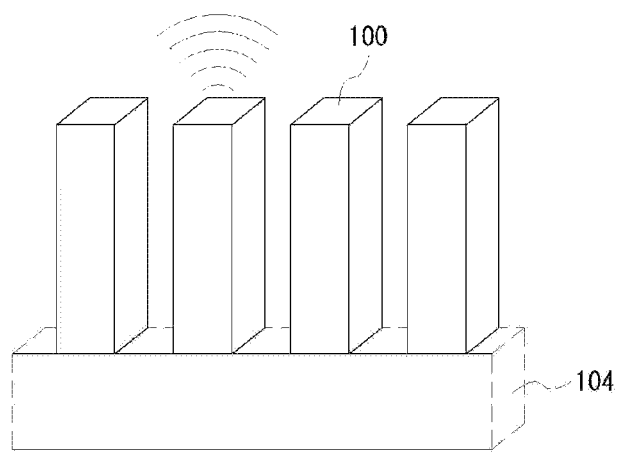
FIG. 2 is a diagram illustrating the shape and operation of piezoelectric rods according to the related art.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of the related art are omitted if it is deemed that they may unnecessarily obscure the essence of the invention.

While such terms as "first" and "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

If a layer, a region, or an element such as a board is described as being expanded "on" or "onto" another element, the element can be expanded directly on or directly over the other element, or one or more interposed elements can be present in-between. In contrast, if an element is described as being expanded "directly on" or "directly onto" another element, there are no interposed elements present in-between. Also, if an element is described as being "connected" or "coupled" to another element, the element can be directly connected or directly coupled to the other element, or one or more interposed elements can be present in-between. In contrast, if an element is described as being "directly connected" or "directly coupled" to another element, there are no interposed elements present in-between.

Relative terms such as "below", "above", "upper", "lower", "horizontal", "lateral", "vertical", or the like can be used in describing the relationship between an element, layer, or region and another element, layer, or region, as illustrated in the drawings. It should be appreciated that such terms are intended to encompass other orientations of the device in addition to the orientations illustrated in the drawings.

Also, in descriptions referencing the accompanying drawings, the same elements are designated the same or related reference numerals regardless of figure numbers, and redundant descriptions relating to such elements are omitted. In describing the present invention, certain detailed explanations of related known art are omitted if it is deemed that such specific explanations may unnecessarily obscure the essence of the present invention.

Figure 3:
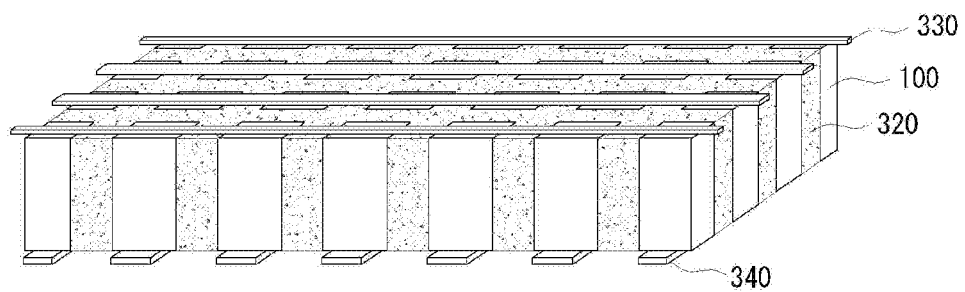
FIG. 3 is a diagram illustrating the shape of an ultrasonic fingerprint sensor according to an embodiment of the present invention.
Figure 4:
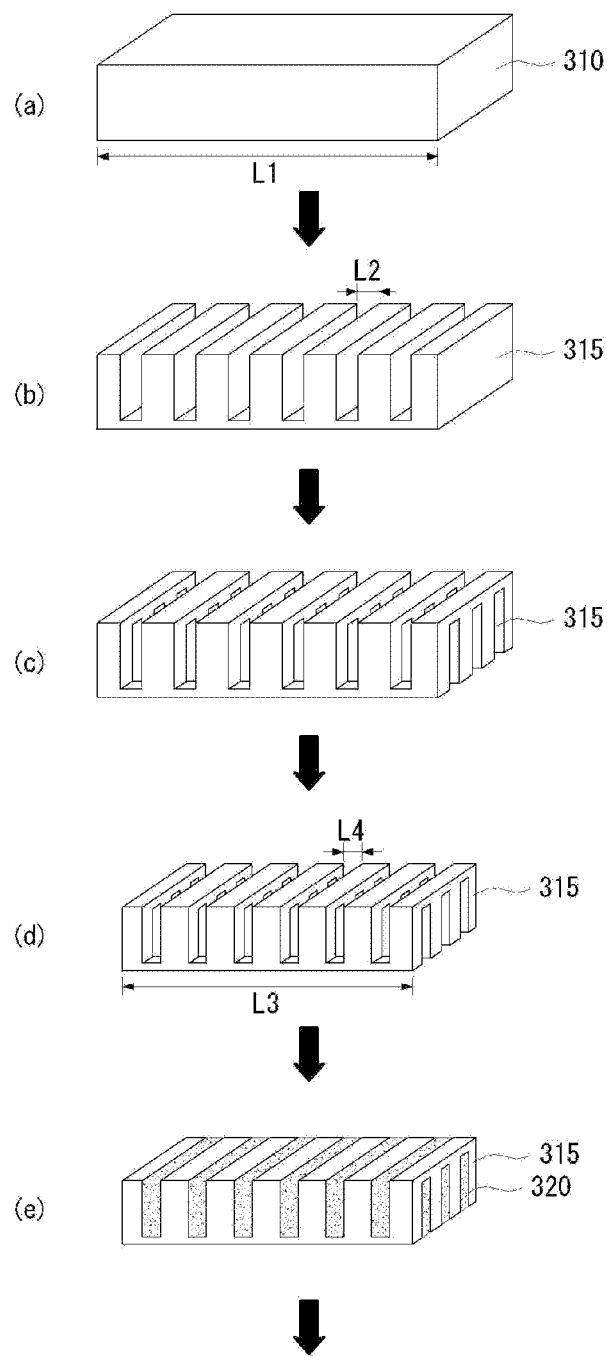
FIG. 4 and FIG. 5 are diagrams illustrating a manufacturing process for an ultrasonic fingerprint sensor according to an embodiment of the present invention.
Figure 5:
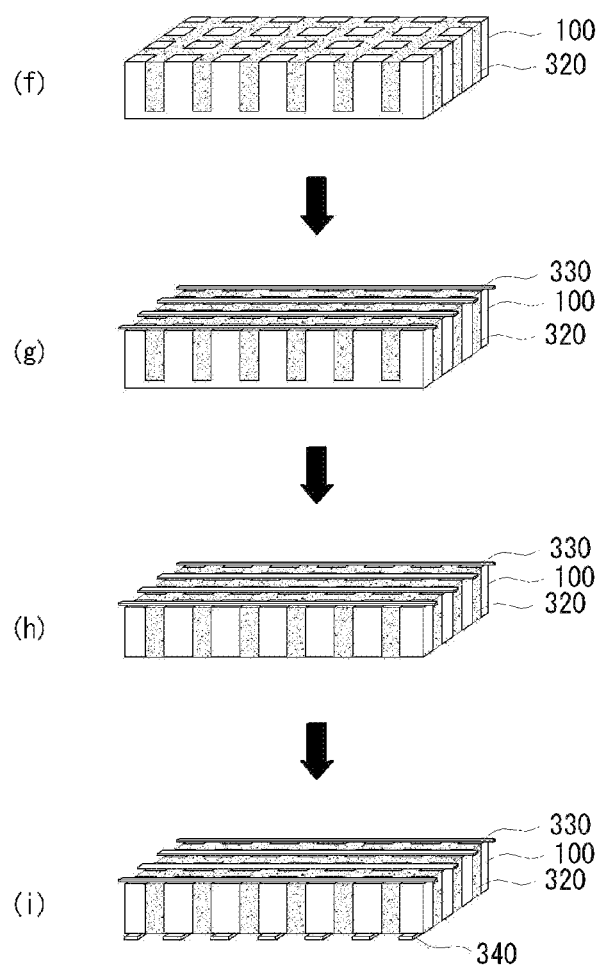

FIG. 3 is a diagram illustrating the shape of an ultrasonic fingerprint sensor according to an embodiment of the present invention, and FIG. 4 and FIG. 5 are diagrams illustrating a manufacturing process for an ultrasonic fingerprint sensor according to an embodiment of the present invention.

Referring to FIG. 3, an ultrasonic fingerprint sensor can include a piezoelectric layer in which a multiple number of piezoelectric rods 100 are arranged as a sensor array of dimensions m×n, a multiple number of first electrode bars 330 that are arranged on a first surface of the piezoelectric layer along a particular direction, and a multiple number of second electrode bars 340 that are arranged on a second surface of the piezoelectric layer not in contact with the first surface, along a direction orthogonal to the arranged direction of the first electrode bars 330.

Each piezoelectric rod 100, which is formed in the shape of a bar or rod, etc., of a particular length, can be formed to exhibit piezoelectric properties, by using a piezoelectric ceramic powder of lead zirconate titanate (PZT), barium titanate, lead titanate, lead zirconate, lead niobium titanate (PNT), lead scandium niobium titanate (PST), etc., for example.

The spaces in-between the individual piezoelectric rods 100 forming the sensor array can be filled in with an insulation material 320. The insulation material 320 can be determined to be of a material that does not suppress the up/down vibrations of the piezoelectric rods 100 when a voltage is applied via the first and second electrode bars 330, 340.

Below, a description is provided of a manufacturing method for an ultrasonic fingerprint sensor according to an embodiment of the present invention, with reference to FIG. 4 and FIG. 5.

Referring to FIG. 4 and FIG. 5, in step (a), a sintered ceramic element 310 in the form of a piezoelectric sheet may be prepared. As described later on, the sintered ceramic element 310 may have the sensor array formed therein to function as the piezoelectric layer mentioned above.

A piezoelectric sheet may be a thin sheet made by thermally processing a piezoelectric ceramic powder such as of PZT, etc., and while it may be called differently as a sheet or as a film depending on the thickness, the term sheet is used in the present specification as a collective reference.

The sintered ceramic element of a piezoelectric sheet form prepared in step (a) may be produced by a sintering processing under incomplete sintering (half sintering) conditions.

In typical cases, including those of a piezoelectric sheet form, a sintered ceramic element is generally formed by applying complete sintering (full sintering) conditions on a piezoelectric material such as PZT, etc. To allow the sintered ceramic element to have a density that is approximately 97~99% of the theoretical density, for example, various temperature conditions and time conditions can be designated as complete sintering conditions.

However, although a sintered ceramic element produced under complete sintering conditions may have excellent properties as a piezoelectric ceramic, it entails the shortcoming of relatively low mechanical workability, such as the cutting speed being limited to a speed of about 1~3 mm per second.

In contrast, the sintered ceramic element 310 in the form of a piezoelectric sheet prepared in step (a) may be produced under incomplete sintering (half sintering) conditions.

Here, the incomplete sintering conditions may have one or more of the heating temperature, heating time, etc., designated as a relatively poor condition compared to the complete sintering conditions described above, so that the sintered ceramic element thus produced may have a relatively lower density (about 80~90% of the theoretical density, for example) compared to that obtained by complete sintering conditions.

The sintered ceramic element 310 produced under incomplete sintering conditions may have a relatively lower level of sintering compared to a sintered ceramic element produced under complete sintering conditions, so that whereas the properties as a piezoelectric ceramic may be relatively lacking, the mechanical workability may be relatively superior.

In step (b), a cutting (dicing) process may be applied in pre-designated intervals (marked L2) in parallel directions along a first direction in a first surface (e.g. the upper surface) of the sintered ceramic element 310 having the form of a piezoelectric sheet, thereby forming a processed ceramic element 315, which corresponds to the sintered ceramic element 310 having troughs formed therein. Here, the cutting depth may be limited to a depth that is relatively shorter than the thickness of the sintered ceramic element 310 such that a remainder region is left at the second surface side.

Then, in step (c), a cutting (dicing) process may be applied in pre-designated intervals in parallel directions along a second direction, which is orthogonal to the first direction, in a second surface (e.g. the lower surface), which does not touch the first surface, of the processed ceramic element 315 having parallel troughs formed therein along the first direction. In this case also, the cutting depth may be limited to a depth that is relatively shorter than the thickness of the sintered ceramic element 310 such that a remainder region is left at the first surface side. Forming the troughs in step (c) can be performed, for convenience, with the processed ceramic element 315 flipped upside down.

Then, in step (d), the processed ceramic element 315 having troughs formed in the first surface along the first direction and troughs formed in the second surface along the second direction may be sintered according to the complete sintering conditions described above.

As the processed ceramic element 315, which underwent incomplete sintering, is sintered according to complete sintering conditions, the processed ceramic element 315 may experience compression, whereby the length of the processed ceramic element 315 and the widths of the troughs may each be reduced (i.e. L1>L3, L2>L4).

As a result, the arranged distances between the piezoelectric rods 100 described later on can be made denser, thereby providing the advantage of enabling the fabrication of an ultrasonic fingerprint sensor with a higher resolution.

Then, in step (e), the troughs formed in the processed ceramic element 315 by the cutting processes along the first direction and second direction may be filled with an insulation material 320.

Then, in step (f), a polishing process (CMP) may be applied on the first surface of the processed ceramic element 315, of which the troughs are filled with the insulation material 320, with the result that the remainder region left at the first surface side may be removed.

Due to the polishing process of step (f), the piezoelectric rods 100 arranged in the form of an m×n array may be exposed at the first surface side, and in step (g), a multiple number of first electrode bars 330 may be formed, with the first electrode bars 330 arranged along a third direction (i.e. one of the first direction and second direction) and electrically connected to the upper end portions of the multiple piezoelectric rods 100.

Then, in step (h), a polishing process (CMP) may be applied on the second surface of the processed ceramic element 315, of which the troughs are filled with the insulation material 320, with the result that the remainder region left at the second surface side may be removed.

Due to the polishing process of step (h), the piezoelectric rods 100 arranged in the form of an m×n array may be exposed at the second surface side, and in step (i), a multiple number of second electrode bar 340 may be formed, with the second electrode bar 340 arranged along a fourth direction (i.e. the other of the first direction and second direction) and electrically connected to the upper end portions of the multiple piezoelectric rods 100. Steps (h) and (i) can be performed, for convenience, with the processed ceramic element 315 flipped upside down.

As described above, a method for manufacturing an ultrasonic fingerprint sensor according to the present embodiment can provide easier processing and faster process speeds by processing troughs in a sintered ceramic element 310 formed according to incomplete sintering conditions. Also, by performing a re-sintering under complete sintering conditions for the processed ceramic element 315 having troughs formed therein, the method can improve the properties of the piezoelectric rods 100 and improve resolution.

While the present invention is described above with reference to a preferred embodiment, the person having ordinary skill in the relevant field of art would understand that various modifications and alterations can be made to the present invention without departing from the spirit and scope of the present invention disclosed in the scope of claims below.

What is claimed is:

1. A manufacturing method for an ultrasonic fingerprint sensor, the manufacturing method comprising:
    (a) preparing a sintered ceramic element in a form of a piezoelectric sheet sintered according to incomplete sintering conditions;
    (b) forming a processed ceramic element by cutting from a first surface of the sintered ceramic element along a first direction in intervals up to such a depth that leaves a remainder region at a second surface and cutting from the second surface of the sintered ceramic element along a second direction in intervals up to such a depth that leaves a remainder region at the first surface, the second surface being a surface opposite from and not touching the first surface, the second direction being perpendicular to the first direction;
    (c) sintering the processed ceramic element according to complete sintering conditions;
    (d) filling an insulation material into troughs formed in the processed ceramic element by the cutting processes of said step (b); and
    (e) polishing the first surface and the second surface to remove the remainder regions at the first surface and the second surface such that piezoelectric rods are exposed while arranged in an array form,
    wherein the remainder regions are portions of the sintered ceramic element remaining due to each of the cutting processes applied in one surface not reaching an opposite surface, a region of the sintered ceramic element for forming a piezoelectric rod is connected at both end portions with a region of the sintered ceramic element for forming another piezoelectric rod by way of the remainder regions,
    the incomplete sintering conditions include one or more of a heating temperature and a heating duration designated as a relatively poor condition compared to the complete sintering conditions, and the sintered ceramic element produced under the incomplete sintering conditions has a relatively lower density compared to a sintered ceramic element produced under the complete sintering conditions.

2. The manufacturing method for an ultrasonic fingerprint sensor according to claim 1, wherein said step (e) comprises:
    polishing the first surface to remove the remainder region present at the first surface side such that the piezoelectric rods are exposed while arranged in an array form;
    forming a plurality of first electrode bars on the first surface side along a third direction to be electrically connected with the exposed end portions of the plurality of piezoelectric rods, the third direction being one of the first direction and the second direction;
    polishing the second surface to remove the remainder region present at the second surface side such that the piezoelectric rods are exposed while arranged in an array form; and
    forming a plurality of second electrode bars on the second surface side along a fourth direction to be electrically connected with the exposed end portions of the plurality of piezoelectric rods, the fourth direction being the other of the first direction and the second direction.

3. An ultrasonic fingerprint sensor manufactured by the manufacturing method for an ultrasonic fingerprint sensor according to claim 1.

4. An ultrasonic fingerprint sensor manufactured by the manufacturing method for an ultrasonic fingerprint sensor according to claim 2.

* * * * *